United States Patent [19]
Hancock

[11] 3,975,677
[45] Aug. 17, 1976

[54] METHOD AND APPARATUS FOR TESTING AN INDUCTIVE DEVICE FOR THE PRESENCE OF A VOLTAGE SUPPRESSOR

[75] Inventor: Charles C. Hancock, Salem, Va.
[73] Assignee: General Electric Company, New York, N.Y.
[22] Filed: Jan. 14, 1975
[21] Appl. No.: 540,893

[52] U.S. Cl. .............................. 324/28; 340/249; 324/51; 324/72.5; 324/122
[51] Int. Cl.² ........................................ G01R 31/02
[58] Field of Search ........... 324/59, 122, 133, 72.5; 340/195, 252, 248 E; 209/81 R

[56] References Cited
UNITED STATES PATENTS

| | | | |
|---|---|---|---|
| 2,933,680 | 4/1960 | Adams | 324/51 |
| 3,281,816 | 10/1966 | Ragmond | 340/249 |
| 3,416,074 | 12/1968 | Schoonover | 324/72.5 |
| 3,562,640 | 2/1971 | Wright | 324/51 |
| 3,829,776 | 8/1974 | Lozoga | 324/122 |

OTHER PUBLICATIONS
Zeluff, "Electronics Manual for Eng.", McGraw Hill, 1949, pp. 702–707.

Primary Examiner—Siegfried H. Grimm
Assistant Examiner—Michael J. Tokar
Attorney, Agent, or Firm—Walter C. Bernkopf; James H. Beusse

[57] ABSTRACT

Testing of inductive devices for the presence of voltage suppressors in circuit with said devices. A voltage responsive indicating element is combined with a circuit for applying a pulsating voltage to an inductive device. The indicating element senses the amplitude of the inductive voltage spike produced by removal of power from the inductive device to thereby indicate the presence or absence of a voltage suppressor.

5 Claims, 3 Drawing Figures

METHOD AND APPARATUS FOR TESTING AN INDUCTIVE DEVICE FOR THE PRESENCE OF A VOLTAGE SUPPRESSOR

BACKGROUND OF THE INVENTION

This invention relates to testing equipment and, more particularly, to testing equipment for determining the presence of a voltage spike suppressor in an inductive device.

In the manufacture of inductive devices such as, for example, relay coils, it is common practice to produce such devices on an assembly line and then to transfer the devices to another location for encapsulation. Depending upon the final intended use, the device may be constructed either with or without a voltage suppressor incorporated therein. The suppressor is utilized to reduce the amplitude of the inductive voltage spike produced by the collapsing flux field when power is removed from the inductive device. For example, if the device is to be used in a semiconductor circuit, voltage suppression may be a necessity to prevent destruction of the semiconductors upon removal of power from the device. During the manufacturing process, inductive devices of both configurations may be delivered for encapsulation at the same time and may become intermingled during the encapsulation process. Because of the relatively small size of the voltage suppressor, it is virtually impossible to visually distinguish between the two configurations once they have been encapsulated. Consequently, it becomes necessary to provide either elaborate safety procedures to attempt to prevent intermingling or to provide for testing of the devices for spike suppression after encapsulation. In order to assure that devices intended for use where voltage suppression is necessary include such suppressors, it has been found necessary to provide some means for testing the encapsulated devices for spike suppression.

It is an object of the present invention to provide an economical and efficient mechanism for testing for the presence of a voltage suppressor in an inductive circuit.

SUMMARY OF THE INVENTION

Accordingly, in one embodiment of the present invention, there is provided testing apparatus including input terminals for connecting the apparatus to a DC power source and output terminals for connecting the apparatus to an inductive device to be tested. A voltage responsive indicating element is connected across the output terminals wherein voltage spikes will be detected by the indicating element. The testing apparatus further includes a switch serially connected between the DC power source and the inductive device to allow pulsating power to be supplied to the inductive device. In an embodiment wherein the inductive device is a relay coil, the testing apparatus is arranged such that at least pair of normally closed contacts of the relay is serially connected between one of the input terminals of the testing apparatus and a corresponding one of the output terminals whereby the pulsating power to the relay coil is produced by the operation of the relay.

BRIEF DESCRIPTION OF THE DRAWINGS

For a better understanding of the present invention reference may be had to the accompanying drawings in which.

DETAILED DESCRIPTION

Figure 1:
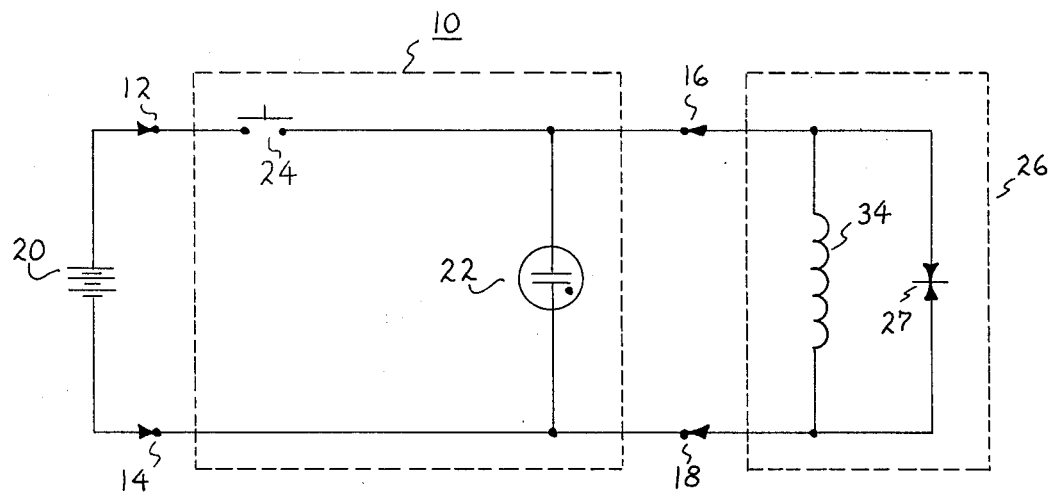
FIG. 1 is a simplified circuit diagram of the apparatus of the present invention.

Referring now to FIG. 1, there is shown a circuit diagram of the testing apparatus of the present invention indicated generally at 10. Apparatus 10 comprises first and second input terminals 12 and 14, respectively, and first and second output terminals 16 and 18, respectively. A DC power source such as a battery 20 is connected to input terminals 12 and 14. A voltage responsive indicating element, herein shown as a neon lamp 22, is connected across output terminals 16 and 18. In practical application, depending upon the voltage of battery 20, it may be necessary that lamp 22 be comprised of two or more lamps in order to establish a proper triggering level. A switch 24 is serially connected between input terminal 12 and output terminal 16 for supplying a pulsating voltage thereto. A voltage suppressor such as a varistor 27 is shown for purposes of illustration to be connected in circuit with device 26.

In operation, an inductive device 26 to be tested is connected across output terminals 16 and 18. Switch 24 is then cyclically operated, either manually or automatically, to apply a pulsating voltage to inductive device 26. Due to the reactance of the inductive circuit 26, a relatively large reactive voltage will appear across terminals 16 and 18 when switch 24 is suddenly open circuited. If there is not a voltage suppressor connected in parallel with inductive circuit 26, the reactive voltage will be sufficient to cause lamp 22 to glow thereby indicating that the suppressor is not in the circuit. If there is a voltage suppressor connected in parallel with inductive device 26, the suppressor will limit the reactive voltage and lamp 22 will not glow. Thus, the testing apparatus provides a simple, economical means of determining the existence and effectiveness of a voltage suppressor in an inductive device.

Figure 2:
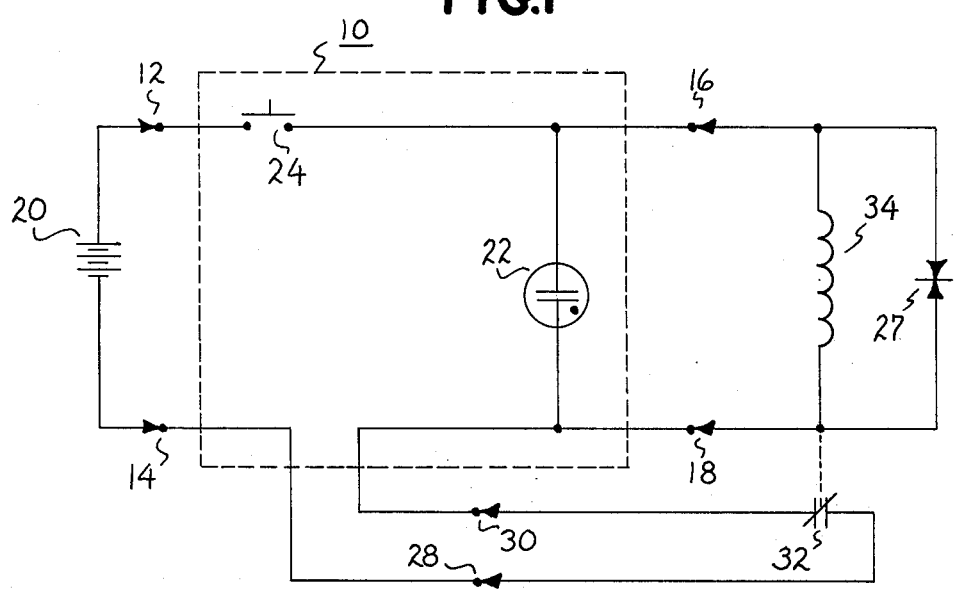
FIG. 2 is a circuit diagram of a specific embodiment of the present invention for testing of a relay coil.

Referring now to FIG. 2, there is shown a second embodiment of the present invention having particular application to testing of relay coils for voltage suppressors. An additional pair of terminals 28 and 30 are provided for connection to a normally closed pair of contacts 32 of a relay coil 34. Coil 34 is connected across terminals 16 and 18. This particular arrangement allows the pulsating voltage to be applied to coil 34 to be produced by the operation of the coil 34 and contacts 32.

In operation of the circuit of FIG. 2, switch 24 is depressed thereby completing a current path from the positive terminal of battery 20 through switch 24, coil 34, and closed contacts 32 to the negative terminal of battery 20. However, as the current increases, coil 34 is actuated causing contacts 32 to open, thus removing power from coil 34. With power removed the flux field created about the coil collapses allowing contacts 32 to return to their normally closed position. As contacts 32 close, power again is applied to coil 34 and the cycle repeats. The collapsing flux field in each cycle of operation gives rise to an inductive voltage spike. If a voltage suppressor is not connected in parallel with coil 34, the voltage spikes will produce a voltage sufficient to maintain lamp 22 aglow during the test. This circuit thus provides a means for testing relay coils for the presence of a voltage suppressor without the necessity of rapidly cycling switch 24 in order to energize lamp 22 for a sufficient observational time period.

Figure 3:
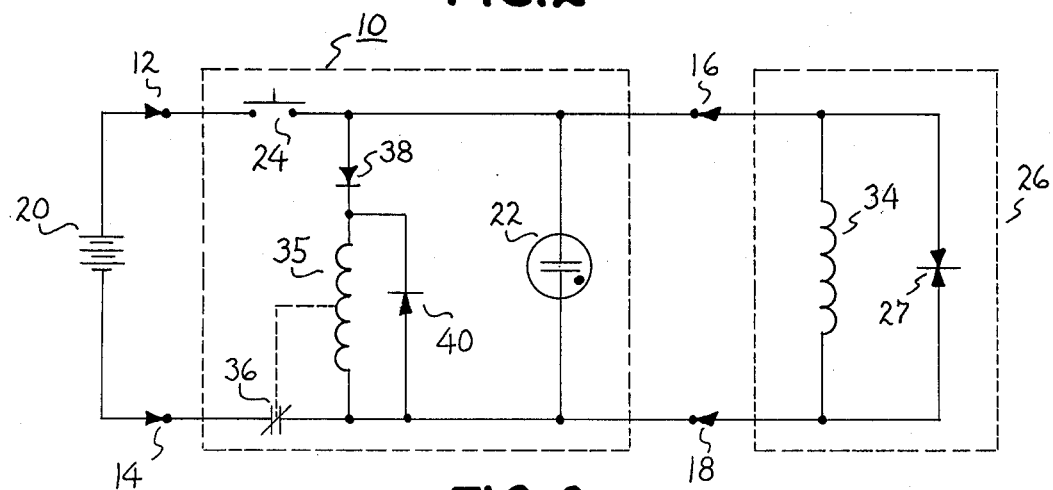
FIG. 3 is a schematic showing an embodiment of the present invention including automatic pulsing of an inductive device.

FIG. 3 shows an alternate embodiment of the present invention which includes a relay to provide automatic cycling of the voltage applied to inductive device 26. The relay comprises a coil 35 and a set of normally closed contacts 36. Contacts 36 are serially connected between input terminal 14 and output terminal 18. Coil 35 is connected across output terminals 16 and 18 by means of a diode 38. A second bypass diode 40 is connected in parallel with coil 35.

In operation, closure of switch 24 allows current to flow from battery 20 through coil 35 via diode 38 and also to inductive device 26. The current into coil 35 creates a flux field which operates to open contacts 36 thereby removing power from both coil 35 and inductive device 26. Diodes 38 and 40 prevent the collapsing field of coil 35 from energizing lamp 22 so that only the collapsing field of inductive device 26 will be detected by lamp 22. Collapse of the flux field of coil 35 allows contacts 36 to revert to their normally closed position thereby allowing power to be reapplied to coil 35 and inductive device 26 and causing the cycle to repeat. Thus the addition of relay coil 35 and contacts 36 provide a means for applying pulse energization to device 26 without the necessity of cycling of switch 24.

It can therefore be seen that there has been provided a simple and economical apparatus for assembly line testing of inductive circuits for the presence of voltage suppressors. It will be appreciated that the method and apparatus of the present invention provide a means for separating devices incorporating suppressors from devices not incorporating suppressors without the necessity of elaborate testing schemes. It will be further appreciated that the present invention obviates the necessity of careful isolation procedures during the manufacturing process and thus allows such inductive devices to be manufactured in a single assembly line and coated in a common encapsulation process at a corresponding savings of time and cost.

It will therefore be seen that the object set forth is efficiently obtained and since certain changes may be made in the above constructions without departing from the scope of the invention, it is intended that all matter contained in the above description or shown in the accompanying drawings shall be interpreted as illustrative and not in a limiting sense.

What is claimed and desired to be secured by Letters Patent of the United States is:

1. Apparatus for testing an inductive device for the presence of a voltage suppressor of the type adapted to limit the maximum amplitude of voltage transients generated by the inductance of said device responsive to the modification of the electrical energization of said device, said apparatus comprising:
   a. first and second input terminals adapted to connect said apparatus to a DC power source of predetermined potential;
   b. first and second output terminals adapted to connect said apparatus to said inductive device;
   c. coupling circuit means for coupling said first input terminal to said first output terminal and said second input terminal to said second output terminal to provide a series circuit connection between said DC power source and said inductive device;
   d. a voltage responsive indicating element adapted to have discrete first and second indicating states connected in circuit between said first and second output terminals, said element being selected to provide a sensory output of a second state solely upon application between said first and second output terminals of a voltage having a magnitude in excess of the maximum voltage magnitude produced when an inductive device containing a suppression device is connected to said output terminals;
   e. said coupling means comprising means adapted to cyclically interrupt said series circuit connection between said DC power source and said inductive device for causing said indicating element to have a first indicating state when said device includes a voltage suppressor and a second indicating state when said device does not include a voltage suppressor.

2. The apparatus as defined in claim 1 wherein said indicating element comprises at least one voltage breakdown device providing a visible light emission upon application to said device of a potential exceeding a specified magnitude.

3. The apparatus defined in claim 1 comprising relay means comprising a solenoid and a normally closed contractor, means for coupling said solenoid in series circuit with said first and second input terminals and means for connecting said contactor in said coupling circuit for periodically energizing said solenoid and for periodically interrupting said series circuit connection between said DC power source and said inductive device.

4. The apparatus as defined in claim 2, wherein said indicating element comprises a neon lamp.

5. The apparatus as defined in claim 2, wherein said inductive device comprises a relay coil having a pair of normally closed contacts, said normally closed contacts being serially connected between one of said input terminals and a corresponding one of said output terminals.

* * * * *